(12) United States Patent
Zhou

(10) Patent No.: US 11,314,358 B2
(45) Date of Patent: Apr. 26, 2022

(54) INFRARED TOUCH DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Mingjun Zhou, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 243 days.

(21) Appl. No.: 16/615,691

(22) PCT Filed: Nov. 5, 2019

(86) PCT No.: PCT/CN2019/115809
§ 371 (c)(1),
(2) Date: Nov. 21, 2019

(87) PCT Pub. No.: WO2021/012466
PCT Pub. Date: Jan. 28, 2021

(65) Prior Publication Data
US 2021/0333927 A1 Oct. 28, 2021

(30) Foreign Application Priority Data
Jul. 19, 2019 (CN) .......................... 201910654503.3

(51) Int. Cl.
G06F 3/042 (2006.01)
G02B 5/02 (2006.01)
G02F 1/1333 (2006.01)

(52) U.S. Cl.
CPC ......... *G06F 3/0421* (2013.01); *G02B 5/0215* (2013.01); *G02B 5/0231* (2013.01); *G02F 1/13338* (2013.01)

(58) Field of Classification Search
CPC ... G06F 3/0421; G02B 5/0215; G02B 5/0231; G02F 1/13338
See application file for complete search history.

(56) References Cited

U.S. PATENT DOCUMENTS

2006/0132945 A1  6/2006 Sano
2009/0310219 A1 12/2009 Nagahama et al.
(Continued)

FOREIGN PATENT DOCUMENTS

CN  1802574 A   7/2006
CN  101578538 A  11/2009
(Continued)

*Primary Examiner* — Vinh T Lam
(74) *Attorney, Agent, or Firm* — Benesch, Friedlander, Coplan & Aronoff LLP

(57) ABSTRACT

An infrared touch display device is provided to include a display panel, an optical adhesive layer, a cover plate and an infrared touch panel that are overlapped in an order from bottom to top, and a microstructure layer. The optical adhesive layer is shaped as a ring and disposed in a peripheral area of an upper surface of the display panel. The area encompassed by the optical adhesive layer forms a vacuum room. The cover plate is disposed on the optical adhesive layer. The infrared touch panel is disposed on the cover plate. The microstructure layer is disposed at a side of the cover plate and has an anti-glare function.

8 Claims, 4 Drawing Sheets

(56) References Cited

U.S. PATENT DOCUMENTS

| | | | |
|---|---|---|---|
| 2010/0272919 A1 | 10/2010 | Hu | |
| 2012/0268403 A1* | 10/2012 | Christiansson | G06F 3/0421 |
| | | | 345/173 |
| 2013/0314368 A1* | 11/2013 | Li | G06F 3/0445 |
| | | | 345/174 |
| 2014/0093726 A1 | 4/2014 | Higashi et al. | |
| 2015/0116833 A1* | 4/2015 | Boyd | G02B 5/0236 |
| | | | 359/599 |
| 2015/0346856 A1* | 12/2015 | Wassvik | G06F 3/042 |
| | | | 345/175 |
| 2016/0026337 A1* | 1/2016 | Wassvik | G02B 6/0031 |
| | | | 345/175 |
| 2016/0202842 A1* | 7/2016 | Uriu | G06F 3/0446 |
| | | | 345/175 |
| 2016/0252665 A1* | 9/2016 | Lee | G02B 1/14 |
| | | | 359/489.07 |
| 2016/0342282 A1* | 11/2016 | Wassvik | G06F 3/0412 |
| 2018/0005003 A1* | 1/2018 | Ryu | G06K 9/00046 |
| 2019/0286869 A1* | 9/2019 | Ling | H01L 27/3234 |
| 2019/0302504 A1* | 10/2019 | Wang | G02F 1/1333 |
| 2020/0257405 A1* | 8/2020 | Bergstrom | G06F 3/0428 |
| 2020/0401270 A1* | 12/2020 | Bergstrom | G02B 5/0236 |
| 2021/0151524 A1* | 5/2021 | Tang | G06K 9/0004 |
| 2021/0232841 A1* | 7/2021 | Wang | G06K 9/209 |

FOREIGN PATENT DOCUMENTS

| | | |
|---|---|---|
| CN | 102419660 A | 4/2012 |
| CN | 103582685 A | 2/2014 |
| CN | 204595820 U | 8/2015 |

\* cited by examiner

INFRARED TOUCH DISPLAY DEVICE

FIELD OF THE DISCLOSURE

The present invention relates to display technologies, and more particularly to an infrared touch display device.

DESCRIPTION OF RELATED ARTS

In the field of displays, infrared touch technologies dominate a large part of markets with the technical maturity, accurate precision in determining a touch and advantage of relatively low cost. The principle of infrared touch technique is to locate and analyze a touch position by way of blocking infrared rays emitted by an infrared frame.

In recent years, infrared touch display devices are used for educational whiteboards and high-end conference machines in the field of displays. In order to operate and demonstrate conveniently, a touch technology for large-sized applications is required. Infrared technologies are currently a mainstream of touch technologies. The infrared touch display device includes a display panel, an infrared touch panel and a cover plate that are overlapped with each other. However, there is a vacuum room existing between the cover plate and the infrared touch panel after they are laminated under a vacuum environment. The cover plate will bend toward a side of the vacuum room due to negative pressure provided by the vacuum room. The cover plate is stretched and this causes the thickness of the cover plate to be uneven. A large difference in light path exists between positions corresponding to different thickness of the cover plate, thereby causing users to perceive rainbow mura which affects visual effects.

Technical Problems

The objective of the present invention is to provide an infrared touch display device, for disposing a microstructure layer between a cover plate and a display panel to solve the technical problem of rainbow mura which affects visual effects.

Technical Solutions

To solve above problems, the present invention provides an infrared touch display device including a display panel, an optical adhesive layer, a cover plate and an infrared touch panel that are overlapped in an order from bottom to top, and a microstructure layer. Specifically, the optical adhesive layer is shaped as a ring and disposed in a peripheral area of an upper surface of the display panel. The area encompassed by the optical adhesive layer forms a vacuum room. The cover plate is disposed on the optical adhesive layer. The infrared touch panel is disposed on the cover plate. The microstructure layer is disposed at a side of the cover plate and has an anti-glare function.

Further, the microstructure layer has a rugged diffuse reflection surface having the anti-glare function.

Further, the microstructure layer is disposed on a surface of the cover plate facing the optical adhesive layer.

Further, the microstructure layer is disposed on a surface of the display panel facing the optical adhesive layer.

Further, the microstructure layer is disposed between the cover plate and the infrared touch panel.

Further, the infrared touch display device further includes an anti-glare layer disposed between the display panel and the microstructure layer.

Further, the microstructure layer includes anti-glare film, i.e., AG film. Further, the microstructure layer further includes a base layer, on which the anti-glare film is disposed.

Further, the shape and size of the infrared touch panel is as the same as the shape and size of the display panel.

Further, the infrared touch panel includes transmitting sensors and receiving sensors, and locating a touch position on the infrared touch panel is carried out by transmitting infrared signals using the transmitting sensors and receiving the infrared signals using the receiving sensors.

Beneficial Effects

The technical effects achieved by the present invention are described below. An infrared touch display device is provided with a microstructure layer disposed between a cover plate and an infrared touch panel. The microstructure layer has a rugged diffuse reflection surface, which can carry out an anti-glare function, thereby improving the problem of rainbow mura and improving visual effects of the infrared touch display device.

Figure 1:
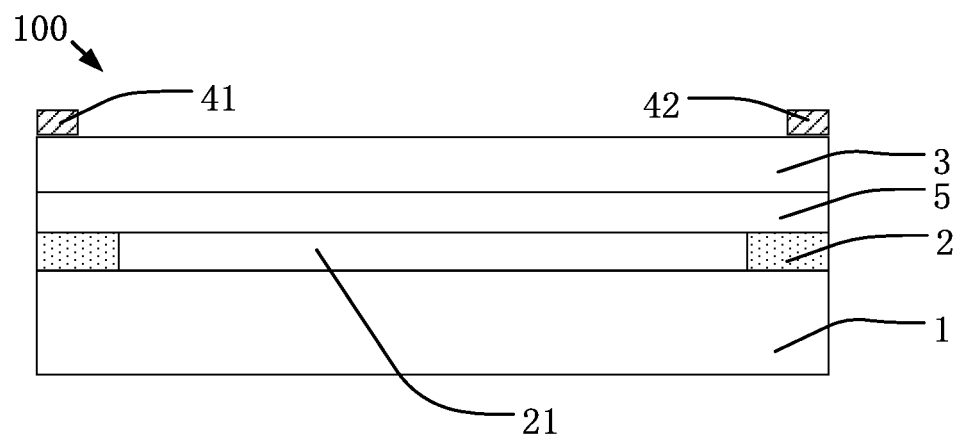
FIG. 1 is a structural schematic diagram illustrating an infrared touch display device according to a first embodiment of the present invention.

Reference numbers in the appending drawings are partially provided below.

- 1 display panel; 2 optical adhesive layer; 3 cover plate; 4 infrared touch panel; 5 microstructure layer;
- 6 anti-glare layer; 21 vacuum room; 31 first side; 32 second side; 33 third side;
- 34 fourth side; 41 transmitting sensor; 42 receiving sensor; 51 anti-glare film; 52 base layer; 100 infrared touch display device

DESCRIPTION OF EMBODIMENTS OF THE DISCLOSURE

The technical solutions in the embodiments of the present invention will be clearly and completely described below with reference to accompanying drawings of the embodiments of the present invention. Obviously, the described embodiments are merely a part of embodiments of the present invention and are not all of the embodiments. Based on the embodiments of the present invention, other embodiments obtained by those of ordinary skill in the art without making any inventive effort are within the scope the present invention seeks to be protected.

The terminology used herein is for the purpose of describing particular embodiments only and is not intended to be limiting of the invention. Singular forms are intended to include the plural forms, unless the context clearly indicates otherwise. It will be understood that the terms "comprises", "has" and "includes" in the specification of the present invention specify the presence of stated features, integers, steps, operations, or their combinations disclosed in the specification of the present invention, but do not preclude the presence or addition of one or more other features, integers, steps, operations, or their combinations. Same reference numbers in the drawings refer to same elements.

Embodiment 1

As shown in FIG. 1, the present embodiment provides an infrared touch display device 100 including a display panel 1, an optical adhesive layer 2, a cover plate 3 and an infrared touch panel 4 that are overlapped in an order from bottom to top, and a microstructure layer 5.

The display panel 1 is such as a liquid crystal display panel, an organic light-emitting diode (OLED) display panel, an active-matrix OLED display panel, a polymer light-emitting diode (PLED) display panel, and so on.

The optical adhesive layer 2 is shaped as a ring and disposed in a peripheral area of an upper surface of the display panel 1. A vacuum room 21 is enclosed by the optical adhesive layer 2. Specifically, the optical adhesive layer 2 is shaped as a ring and disposed in a peripheral area of an upper surface of the display panel 1, and an area encompassed by the optical adhesive layer 2 forms a vacuum room 21. In the present embodiment, the optical adhesive layer 2 is preferable to be a rectangular annulus. The center of the rectangular annulus is where the vacuum room 21 is located.

The optical adhesive layer 2 is a liquid glue or a solid glue, and specifically includes a solid optical glue or a liquid optical glue, and may be made of a material such as acrylic, PU, Silicone, and so on. The optical adhesive layer 2 has a strong adhesion property and plays a role in fixing the connection between the cover plate 3 and the display panel 1. solid optically clear adhesive is an UV-moisture dual-curing optical adhesive that can be cured under UV light. The cured optical adhesive has excellent weather resistance property, especially excellent anti-expansion and anti-explosion properties, and greatly improves safety, reliability, durability and aesthetics in the area of displays, and is characterized by high light transmittance, strong adhesion, low haze, low shrinkage and yellowing resistance, and is mainly applicable to full lamination applications including medium and large sized computers, liquid crystal displays, all-in-one machines, and so on.

The cover plate 3 is disposed on the upper surface of the display panel 1, and is connected with the display panel 1 via the optical adhesive layer 2. In the present embodiment, the cover plate 3 is preferable to be a glass cover plate. The cover plate 3 is used to protect the display panel 1. User operation can be directly onto the cover plate 3.

Figure 2:
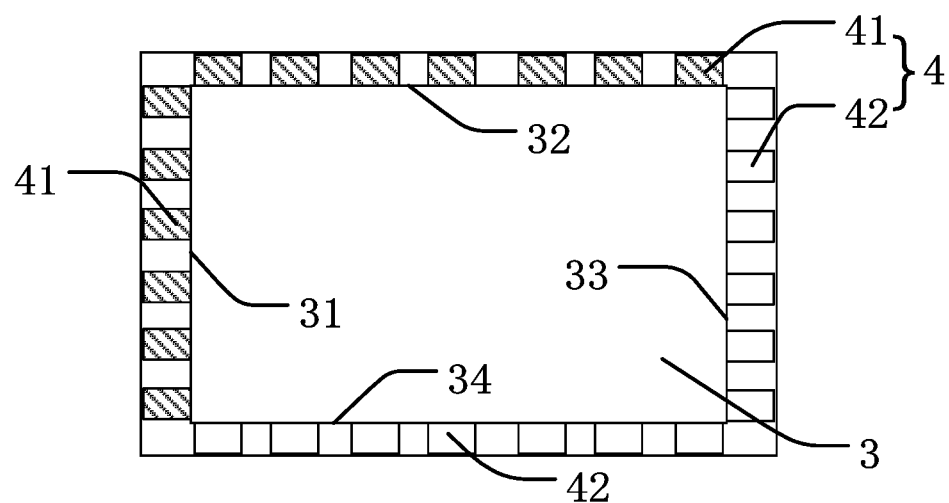
FIG. 2 is a top view of the infrared touch display device according to the first embodiment of the present invention.

As shown in FIG. 2, which is a top view of the infrared touch display device 100, the infrared touch panel 4 is disposed in a peripheral area of an upper surface of the cover plate 3. The infrared touch panel 4 includes a plurality of transmitting sensors 41 and a plurality of receiving sensors 42. The cover plate 3 is rectangular and includes a first side 31 and a second side 32 that are adjacent to each other, a third side 33 opposite to the first side 31 and a fourth side 34 opposite to the second side 32. The plurality of transmitting sensors 41 are disposed at both of the first side 31 and the second side 32. The plurality of receiving sensors 42 are disposed at both of the third side 33 and the fourth side 34. The transmitting sensors 41 and the receiving sensors 42 are arranged in one-to-one correspondence.

Figure 3:
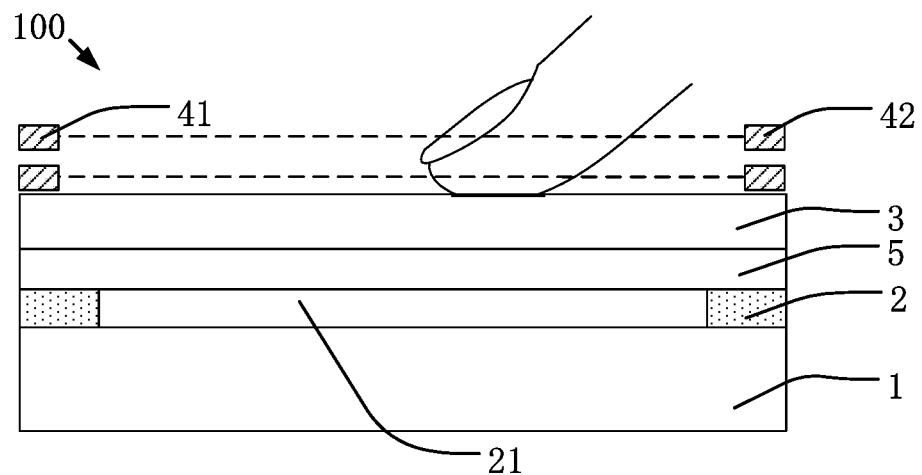
FIG. 3 is a schematic diagram illustrating principles of the infrared touch display device according to the first embodiment of the present invention.

As shown in FIG. 3, which is a schematic diagram illustrating touch principles according to the present embodiment. The transmitting sensors 41 and the receiving sensors 42 in the peripheral area of the upper surface of the cover plate 3 are arranged in multiple layers. The transmitting sensors 41 and the receiving sensors 42 corresponding to the transmitting sensors 41 are disposed in each layer. Locating a touch position on the infrared touch panel 4 is carried out by transmitting infrared signals using the transmitting sensors 41 and receiving the infrared signals using the receiving sensors 42. Since the infrared touch panel 4 is disposed on the peripheral area of the upper surface of the cover plate 3, user operation such as touching, clicking, and so on can be directly made onto the cover plate 3. The infrared touch panel 4 is used to sense the positions being touched or clicked. When the infrared touch panel 4 is touched, the infrared signals are blocked such that the receiving sensors 42 cannot receive the infrared signals transmitted by the transmitting sensors 41. In such a way, a corresponding touch position can be detected. A plurality of groups of paired transmitting sensors 41 and receiving sensors 42 form a net structure. A plurality of layers of transmitting sensors 41 and receiving sensors 42 are used to detect a touch distanced from the cover plate 3, and this is a known art and is not repeated herein.

As shown in FIG. 1, the microstructure layer 5 is disposed between the cover plate 3 and the display panel 1 in order to enhance a display effect. The microstructure layer 5 has a rugged diffuse reflection surface having the anti-glare function. The microstructure layer 5 has a haze of more than 10%.

In the present embodiment, the microstructure layer 5 is disposed on a surface of the cover plate 3 facing the optical adhesive layer 2.

Figure 4:
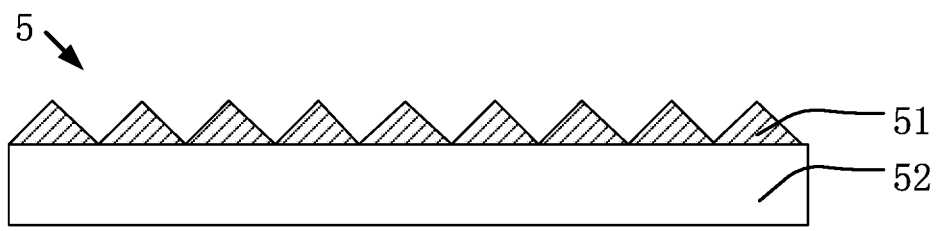
FIG. 4 is a structural schematic diagram illustrating a microstructure layer according to the first embodiment of the present invention.

As shown in FIG. 4, the microstructure layer 5 includes an anti-glare film 51, i.e., the rugged diffuse reflection surface. The anti-glare film (AG film) 51 is a transparent thin film, which is used in a display or a screen for lowering dazzling glare. The glare is caused by reflected light from the surface of the screen, and will cause headaches and eye strain and lower work efficiency. The anti-glare film 51 is formed by subjecting a hard coat (HC) material, which is a cured transparent film, to a matte treatment. The anti-glare film 51 blurs the reflected light (i.e., scattering the light), thereby achieving an anti-glare effect. The matte treatment includes forming the anti-glare film 51 by etching a film layer having the rugged diffuse reflection surface. The rugged diffuse reflection surface of the anti-glare film 51 can effectively improve visual interference of the reflection. The material of the anti-glare film 51 includes an optical grade plastic and preferably includes polymethyl methacrylate (PMMA), polyethylene terephthalate (PET) or polystyrene (PS). The anti-glare film has a haze of more than 10%.

In the present embodiment, the anti-glare film 51 is formed by subjecting the surface of the cover plate 3 facing the optical adhesive layer 2 to the matte treatment. The matte treatment includes forming the anti-glare film 51 by etching a film layer surface. The microstructure layer 5 can effectively improve visual interference of the reflection.

As shown in FIG. 4, the microstructure layer 5 further includes a base layer 52, on which the anti-glare film 51 is disposed. The presence of the base layer 52 can make the microstructure layer 5 attach to the cover plate 3 via the base layer 52, rather than merely forming the microstructure layer 5 on the cover plate 3 by the matte treatment. This is convenient and saves the processing time.

The material of the base layer 52 is as the same as the material of the anti-glare film 51, and includes an optical grade plastic and preferably includes polymethyl methacrylate (PMMA), polyethylene terephthalate (PET) or polystyrene (PS). The anti-glare film 51 is formed on the base layer 52 by the matte treatment. The matte treatment includes etching a film layer having a rugged diffuse reflection surface, that is, the formed anti-glare film 51 and the base layer 52 are of an integrated structure.

Embodiment 2

Figure 5:
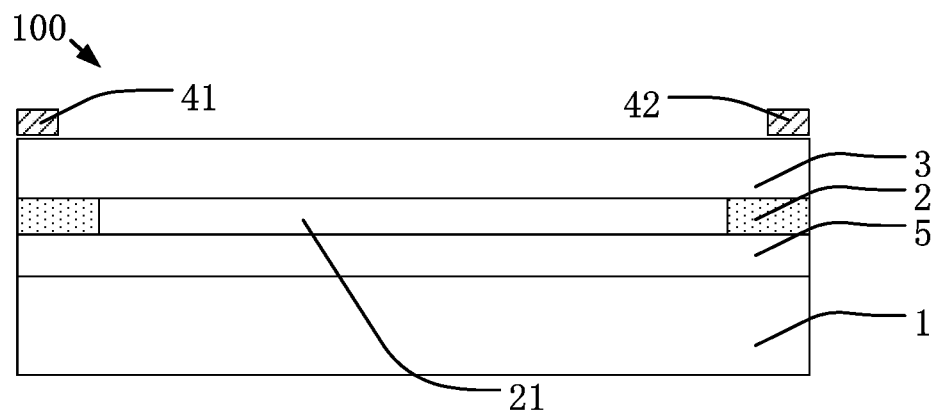
FIG. 5 is a structural schematic diagram illustrating an infrared touch display device according to a second embodiment of the present invention.

As shown in FIG. 5, the second embodiment includes all of the technical features of the first embodiment but the differences between them are that the microstructure layer 5 in the second embodiment is disposed on a surface of the display panel 1 facing the optical adhesive layer 2, rather than disposed on a surface of the cover plate 3 facing the optical adhesive layer 2 in the first embodiment.

In the present embodiment, the anti-glare film 51 is formed by subjecting the surface of the display panel 1 facing the optical adhesive layer 2 to the matte treatment. The matte treatment includes forming the anti-glare film 51 by etching a film layer surface. The microstructure layer 5 can effectively improve visual interference of the reflection.

As shown in FIGS. 4 and 5, the microstructure layer 5 includes the anti-glare film 51 and the base layer 52, on which the anti-glare film 51 is disposed. The presence of the base layer 52 can make the microstructure layer 5 attach to the display panel 1 via the base layer 52, rather than merely forming the microstructure layer 5 on the display panel 1 by the matte treatment. This is convenient and saves the processing time.

Embodiment 3

Figure 6A:
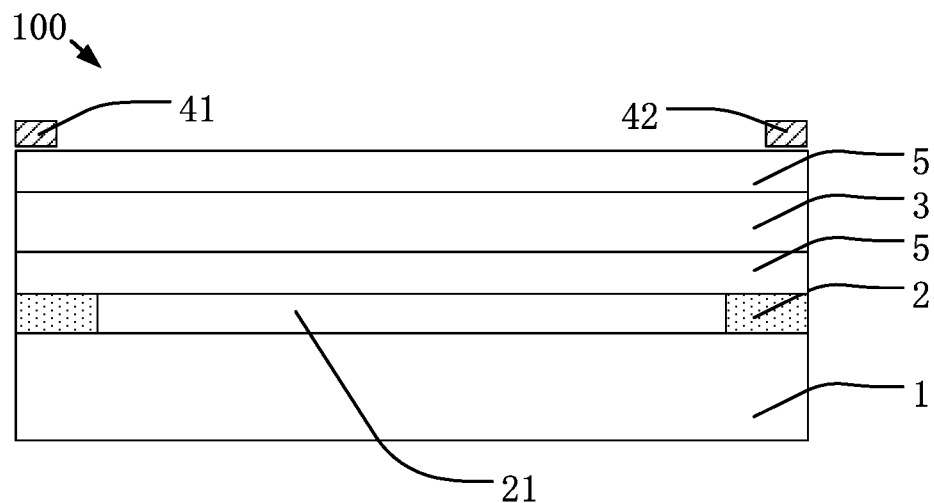
FIG. 6*a* is a structural schematic diagram illustrating an infrared touch display device according to a third embodiment of the present invention.
Figure 6B:
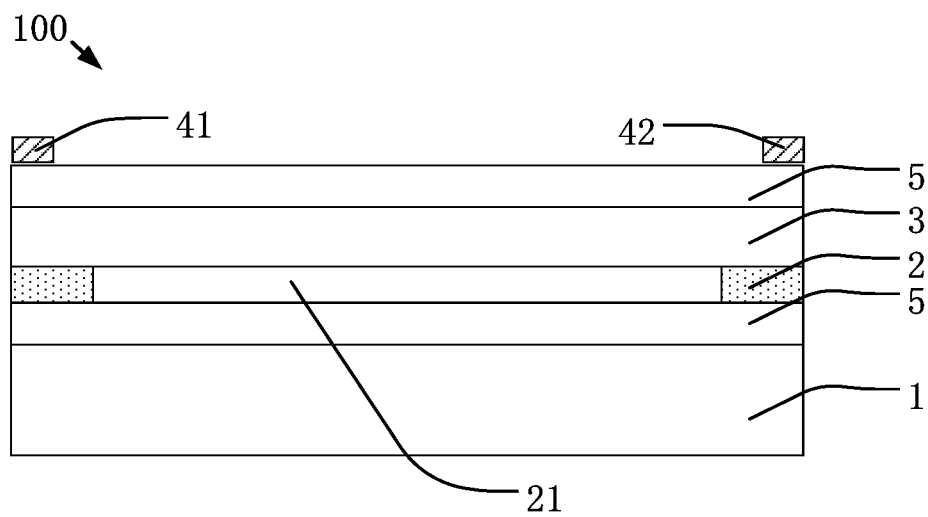
FIG. 6*b* is a structural schematic diagram illustrating another infrared touch display device according to the third embodiment of the present invention.

As shown in FIGS. 6a and 6b, in order to enhance the display effect in a further step, the third embodiment includes all of the technical features in the first embodiment and the second embodiment but the differences between them are that in the third embodiment, there is a second microstructure layer 5 disposed between the cover plate 3 and the infrared touch panel 4.

FIGS. 6a and 6b are two structural schematic diagrams in accordance with the third embodiment. The difference between FIG. 6a and FIG. 1 is that on the basis of FIG. 1, the second microstructure layer 5 is added to the surface of the cover plate 3 facing the optical adhesive layer 2. The difference between FIG. 6b and FIG. 5 is that on the basis of the FIG. 5, the second microstructure layer 5 is added to the surface of the display panel 1 facing the optical adhesive layer 2. Disposing the second microstructure layer 5 above the cover plate 3 and disposing the microstructure layer 5 below the cover plate 3 will increase the haze of the infrared touch display device 100, thereby carrying out the anti-glare function in a further step.

It should be noted that in other embodiments, it can only dispose the second microstructure layer 5 above the cover plate 3, rather than disposing the microstructure layer 5 below the cover plate 3. This implementation can also achieve the anti-glare function.

Embodiment 4

Figure 7:
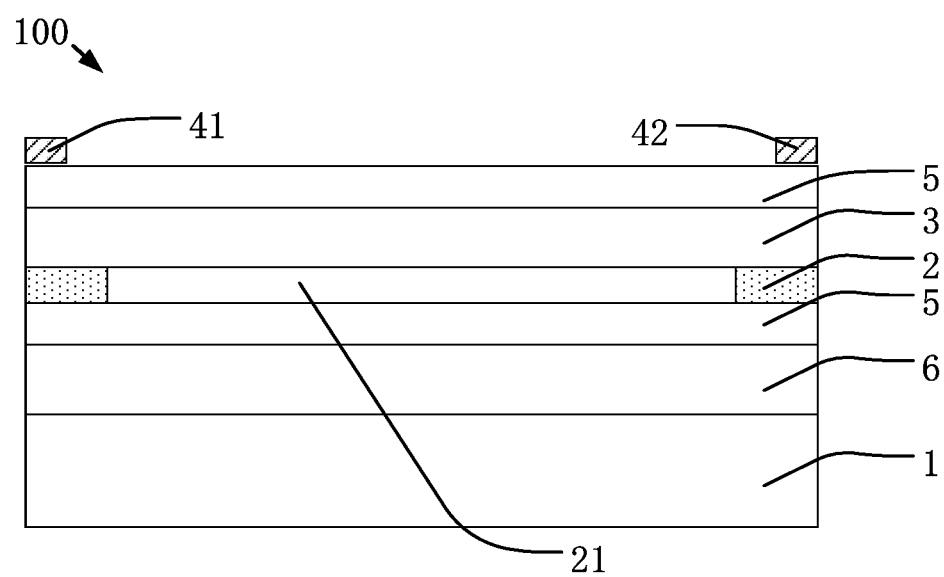
FIG. 7 is a structural schematic diagram illustrating an infrared touch display device according to a fourth embodiment of the present invention.

As shown in FIG. 7, the fourth embodiment includes all of the technical features in the third embodiment but the difference between them are that the infrared touch display device 100 in the fourth embodiment further includes an anti-glare layer 6 disposed on the display panel 1, that is, between the display panel 1 and the first microstructure layer 5. The material of the anti-glare layer 6 includes an optical grade plastic and preferably includes polymethyl methacrylate (PMMA), polyethylene terephthalate (PET) or polystyrene (PS). The anti-glare layer 6 has a haze of a certain degree, for example, a haze of more than 17%. The anti-glare film has a haze of more than 10%. Their superimposition will further increase the haze of the infrared touch display device 100, thereby achieving the anti-glare function in a further step.

As shown in FIG. 7, the present embodiment preferably makes the anti-glare layer 6 and the microstructure layer 5 be disposed adjacent to each other. This enables the anti-glare layer 6 to be processed with the matte treatment to form the microstructure layer 5. This is convenient and saves the processing time.

The technical effects achieved by the present invention are described below. An infrared touch display device is provided with a microstructure layer disposed between a cover plate and an infrared touch panel. The microstructure layer has a rugged diffuse reflection surface, which can carry out an anti-glare function, thereby improving the problem of rainbow mura and improving visual effects of the infrared touch display device.

Above descriptions are preferred embodiments of the present invention. It should be noted that various modifications and alterations can be made by persons skilled in this art without departing from the principles of the present invention, and that all modifications and alterations are within the scope of the present invention.

The invention claimed is:

1. An infrared touch display device, comprising:
a display panel;
an optical adhesive layer, shaped as a ring and disposed in a peripheral area of an upper surface of the display panel, an area encompassed by the optical adhesive layer forming a vacuum room;
a cover plate, disposed on the optical adhesive layer;
an infrared touch panel, disposed on the cover plate;
a first microstructure layer, disposed at a side of the cover plate and having an anti-glare function; and
a second microstructure layer, disposed at the opposite side of the cover plate and having an anti-glare function,
wherein each of the first microstructure layer and the second microstructure layer comprises a base layer and an anti-glare film, the anti-glare film is disposed on the base layer, and the presence of the base layer makes each of the first microstructure layer and the second microstructure layer attach to the cover plate via the base layer,
wherein the first microstructure layer and the second microstructure layer are configured to alleviate rainbow mura caused by a large difference in light path exists between positions corresponding to different thickness of the cover plate.

2. The infrared touch display device according to claim 1, wherein the first microstructure layer has a rugged diffuse reflection surface having the anti-glare function.

3. The infrared touch display device according to claim 1, wherein the first microstructure layer is disposed on a surface of the cover plate facing the optical adhesive layer.

4. The infrared touch display device according to claim 1, wherein the first microstructure layer is disposed on a surface of the display panel facing the optical adhesive layer.

5. The infrared touch display device according to claim 1, wherein the second microstructure layer is disposed between the cover plate and the infrared touch panel.

6. The infrared touch display device according to claim 4, further comprising an anti-glare layer disposed between the display panel and the first microstructure layer.

7. The infrared touch display device according to claim 1, wherein the shape and size of the infrared touch panel is as the same as the shape and size of the display panel.

8. The infrared touch display device according to claim 1, wherein the infrared touch panel comprises transmitting sensors and receiving sensors, and locating a touch position on the infrared touch panel is carried out by transmitting infrared signals using the transmitting sensors and receiving the infrared signals using the receiving sensors.

* * * * *